United States Patent
Gronenborn et al.

(10) Patent No.: US 9,403,378 B2
(45) Date of Patent: Aug. 2, 2016

(54) LIGHTING APPARATUS FOR PROVIDING LIGHT FOR PROCESSING AN OBJECT

(71) Applicant: KONINKLIJKE PHILIPS N.V., Eindhoven (NL)

(72) Inventors: Stephan Gronenborn, Eindhoven (NL); Gero Heusler, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/394,859

(22) PCT Filed: Apr. 16, 2013

(86) PCT No.: PCT/IB2013/053008
§ 371 (c)(1),
(2) Date: Oct. 16, 2014

(87) PCT Pub. No.: WO2013/156926
PCT Pub. Date: Oct. 24, 2013

(65) Prior Publication Data
US 2015/0097914 A1    Apr. 9, 2015

Related U.S. Application Data

(60) Provisional application No. 61/635,918, filed on Apr. 20, 2012.

(51) Int. Cl.
*B41J 2/45* (2006.01)
*B41J 2/455* (2006.01)
*B41J 2/47* (2006.01)
*B41J 2/475* (2006.01)
(Continued)

(52) U.S. Cl.
CPC .. *B41J 2/45* (2013.01); *B41J 2/315* (2013.01); *B41J 2/455* (2013.01); *B41J 2/47* (2013.01); *B41J 2/475* (2013.01); *G03F 7/2004* (2013.01); *G03F 7/2008* (2013.01)

(58) Field of Classification Search
CPC ............... B41J 2/45; B41J 2/455; B41J 2/47; B41J 2/475; F21Y 2105/003
See application file for complete search history.

(56) References Cited

U.S. PATENT DOCUMENTS 5,877,899 A * 3/1999 Stern et al. ............... 359/633
6,022,124 A   2/2000 Bourn et al.
(Continued)

FOREIGN PATENT DOCUMENTS

EP    1072884 A2    1/2001
EP    2512121 A1   10/2012
(Continued)

*Primary Examiner* — Kristal Feggins
*Assistant Examiner* — Kendrick Liu

(57) ABSTRACT

The invention relates to a lighting apparatus (2) for providing light for processing an object (3). A ring of light sources generates processing light for processing the object and an imaging unit (9) images the ring of light sources onto a working plane (16) in which the object is to be processed, wherein the ring of light sources and the imaging unit are configured such that images of the light sources in the working plane are distributed equidistantly in a direction being parallel to a diameter of the imaged ring in the working plane. The ring arrangement allows for a high quality imaging with a relatively small and technically simple optical element. A relatively small lighting apparatus can therefore be provided, which can be used for applications like laser printing.

20 Claims, 7 Drawing Sheets

(51) Int. Cl.
*G03F 7/20* (2006.01)
*B41J 2/315* (2006.01)

(56) References Cited

U.S. PATENT DOCUMENTS

| | | | |
|---|---|---|---|
| 7,333,735 | B1 | 2/2008 | Goorjian |
| 2004/0046860 | A1 | 3/2004 | Beier |
| 2007/0273957 | A1* | 11/2007 | Zalevsky ............ G02B 27/0927 359/326 |
| 2008/0290787 | A1* | 11/2008 | Cok .................... H01L 51/5203 313/503 |
| 2009/0309952 | A1* | 12/2009 | Akatsu .......................... 347/224 |
| 2011/0132549 | A1* | 6/2011 | Sercel ................ B23K 26/4075 156/712 |
| 2011/0148328 | A1 | 6/2011 | Joseph et al. |
| 2013/0021593 | A1* | 1/2013 | Onvlee ................ B65H 23/245 355/72 |

FOREIGN PATENT DOCUMENTS

| | | |
|---|---|---|
| JP | 2002353131 A | 12/2002 |
| JP | 2009194101 A | 8/2009 |
| WO | 9838492 A1 | 9/1998 |
| WO | 2010003163 A2 | 1/2010 |
| WO | 2011021140 A2 | 2/2011 |

* cited by examiner

LIGHTING APPARATUS FOR PROVIDING LIGHT FOR PROCESSING AN OBJECT

CROSS-REFERENCE TO PRIOR APPLICATIONS

This application is the U.S. National Phase application under 35 U.S.C. §371 of International Application No. PCT/IB2013/053008, filed on Apr. 16, 2013, which claims the benefit of U.S. Patent Application No. 61/635,918, filed on Apr. 20, 2012. These applications are hereby incorporated by reference herein.

FIELD OF THE INVENTION

The invention relates to a lighting apparatus for providing light for processing an object. The invention relates further to a processing apparatus, a processing method and a processing computer program for processing an object in a working plane.

BACKGROUND OF THE INVENTION

US 2004/0046860 A1 discloses a laser printer comprising a two-dimensional array of vertical-cavity surface-emitting lasers (VCSELs) and an optical imaging unit for imaging the two-dimensional array of VCSELs onto a working plane. The optical imaging unit needs to be technically relatively complex and to have relatively large dimensions, in order to provide high quality imaging without significant optical aberrations as needed for high quality laser printing.

SUMMARY OF THE INVENTION

It is an object of the present invention to present a lighting apparatus for providing light for processing an object with high quality, wherein a relative small optical imaging unit can be used. It is a further object of the present invention to provide a processing apparatus, a processing method and a processing computer program for processing an object in a working plane, which can use the lighting apparatus.

In a first aspect of the present invention a lighting apparatus for providing light for processing an object is presented, wherein the lighting apparatus comprises:
 a ring of light sources for generating processing light for processing the object,
 an imaging unit for imaging the ring of light sources onto a working plane in which the object is to be processed,
 wherein the ring of light sources and the imaging unit are configured such that images of the light sources in the working plane are distributed equidistantly in a direction being parallel to a diameter of the imaged ring in the working plane.

A high quality imaging of a ring of light sources onto a working plane can be provided by a relatively small and technically simple imaging unit like an optical lens. The imaging unit can therefore be a relatively small and technically simple optical element, wherein the imaging unit still provides a high quality imaging of the ring of light sources. Moreover, since the ring of light sources and the imaging unit are configured such that images of the light sources in the working plane are distributed equidistantly in a direction being parallel to a diameter of the imaged ring in the working plane, the lighting apparatus can be used in a processing apparatus for processing the object such that a homogeneous processing of the object along a line being parallel to the diameter of the imaged ring can easily be provided. Thus, the lighting apparatus can be used to provide a high quality processing of the object, without needing a relatively bulky and technically complex imaging unit. This can also lead to reduced costs for manufacturing the lighting apparatus.

The light sources of the ring arrangement are preferentially arranged such that the centers of the light sources are located within an area between two concentric circles defining the ring. Preferentially, the radius of the inner circle is larger than 50 percent, further preferred larger than 75 percent and even further preferred larger than 90 percent of the radius of the outer circle. The ring of light sources and the imaging unit are preferentially adapted such that a central circle, which is centrally located between the inner circle and the outer circle of the ring, his most sharply imaged onto the working plane.

The light sources are preferentially individually addressable and are adapted to generate light pulses. The light pulses of different light sources may not be provided simultaneously, but consecutively. Thus, in the working plane not the complete imaged ring may be present, but only a part generated by the respective light source providing the respective light pulse. The light sources are preferentially lasers, especially VCSELs.

The configuration of the ring of light sources and the imaging unit is described as being such that images of the light sources in the working plane are distributed equidistantly in a direction being parallel to a diameter of the imaged ring in the working plane, i.e. the imaged ring comprises a diameter which defines a direction in which the images of the light sources are equidistantly distributed. Alternatively, this configuration could also be described as being such that mathematical projections of images of the light sources onto a diameter of the imaged ring in the working plane are distributed equidistantly, wherein a mathematical projection is performed along a line being normal to the diameter and wherein the respective mathematical projection and the respective image have the same dimensions. Since the mathematical projections of the images are distributed equidistantly along the diameter of the imaged ring, the distance between centers of neighboring mathematical projections along the diameter is preferentially similar for different pairs of neighboring mathematical projections, wherein neighboring mathematical projections can overlap, can be adjacent to each other, or there can be a gap between neigboring mathematical projections.

Thus, in an embodiment the ring of light sources and the imaging unit are configured such that the mathematical projections of the images of the light sources onto the diameter of the imaged ring in the working plane are adjacent to each other, i.e. in an embodiment the light sources are arranged such that there is no gap between neighboring mathematical projections of the images of the light sources onto the diameter of the imaged ring in the working plane and also no overlap between these mathematical projections. This leads to a lighting apparatus, which can be used by a processing apparatus for providing a processing of the object with a further increased degree of homogeneity along the diameter.

In another embodiment the ring of light sources and the imaging unit are configured such that the projections of the images of the light sources onto the diameter of the imaged ring in the working plane overlap. This allows for an increased spatial resolution of processing the object along the diameter. In a further embodiment the ring of light sources and the imaging unit are configured such that there is a gap between neighboring mathemtical projections of the images of the light sources onto the diameter of the imaged ring in the working plane.

In an embodiment the imaged ring forms a circle in the working plane, which has a radius R defined by $R=(N-1)/2 \cdot p$, wherein N is the number of light sources and p is the pitch of the images, i.e. the distance between the centers of neighboring images of the light sources in the working plane in the direction of the diameter. The ring of light sources and the imaging unit can be configured such that positions of the images of the light sources in a direction being perpendicular the diameter are defined by integer multiples of the distance between neighboring light sources in the direction of the diameter. If the lighting apparatus is comprised by a processing apparatus like a printing apparatus for processing an object, which comprises a moving unit for moving the object and the lighting apparatus with respect to each other in a movement direction, this may allow for an easier concept for the processing apparatus, as the time delay between different pixels, i.e. between different images of the light sources, is always an integer multiple of the relative velocity between the lighting apparatus and the object divided by the distance of the pixel distance in the movement direction.

In a further aspect of the present invention a processing apparatus for processing an object is provided, wherein the processing apparatus comprises a lighting apparatus. The processing apparatus preferentially comprises a moving unit for moving the object and the lighting apparatus with respect to each other in a movement direction, wherein the movement direction is perpendicular to the diameter of the imaged ring. It is further preferred that the processing apparatus comprises a control unit for controlling at least one of the lighting apparatus and the moving unit such that during operation, when the moving unit moves the lighting apparatus and the object relative to each other, light pulses of different light sources form a straight line on the object in the working plane. Thus, the object can be processed line-by-line with high quality, while the object and the lighting apparatus are moved with respect to each other. For instance, the object can be arranged on a conveyer belt or another moving unit for moving the object with respect to the lighting apparatus, while the object is processed line-by-line.

The processing apparatus is preferentially adapted to perform at least one of the following procedures: printing, melting, sintering. The printing may be a direct printing, wherein light provided by the lighting apparatus directly induces changes of, for instance, the color and/or the reflectivity of the object, or the printing may be an indirect printing, wherein light provided by the lighting apparatus produces heat, which changes, for instance, the color, the reflectivity and/or the shape of the object. The printing may also involve the preparation of printing plates, which may be regarded as being the object, wherein the printing plates may be directly or indirectly influenced by light and wherein a light induced or heat induced change of adhesion of water- or oil-immersed color may be provided. The processing apparatus can also be adapted to perform a computer-to-plate (CTP) printing process.

In a further aspect of the present invention a processing method for processing an object is presented, wherein the processing method comprises:
  generating processing light for processing the object by a ring of light sources,
  imaging the ring of light sources onto a working plane in which the object is to be processed by an imaging unit, wherein images of the light sources in the working plane are distributed equidistantly in a direction being parallel to a diameter of the imaged ring in the working plane,
  moving the object and the lighting apparatus with respect to each other in a movement direction by a moving unit, wherein the movement direction is perpendicular to the diameter of the imaged ring.

In a further aspect of the present invention a processing computer program for processing an object in a working plane is presented, wherein the processing computer program comprises program code means for causing a processing apparatus as defined in claim 9 to carry out the steps of the processing method as defined in claim 14, when the processing computer program is run on a computer controlling the processing apparatus.

It shall be understood that the lighting apparatus of claim 1, the processing apparatus of claim 9, the processing method of claim 14 and the processing computer program of claim 15 have similar and/or identical preferred embodiments, in particular, as defined in the dependent claims.

It shall be understood that a preferred embodiment of the invention can also be any combination of the dependent claims with the respective independent claim.

These and other aspects of the invention will be apparent from and elucidated with reference to the embodiments described hereinafter.

DETAILED DESCRIPTIONS OF EMBODIMENTS

Figure 1:
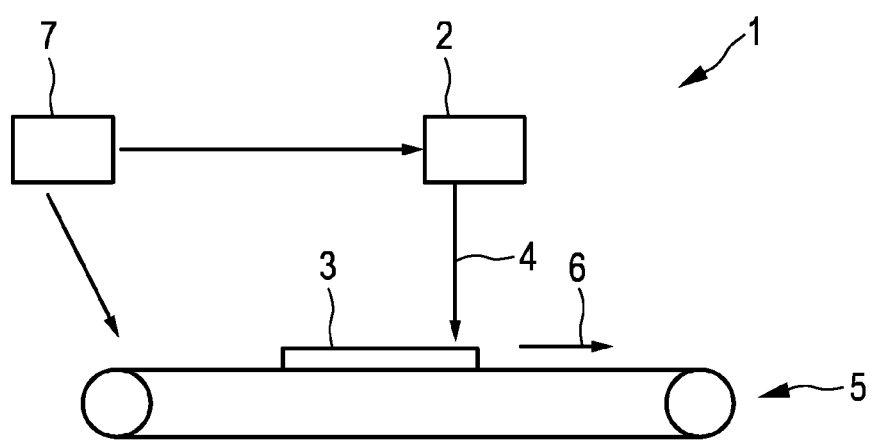
FIG. 1 shows schematically and exemplarily an embodiment of a processing apparatus for processing an object,
FIG. 2 schematically and exemplarily illustrates components of a lighting apparatus of the processing apparatus,
FIG. 3 schematically and exemplarily illustrates an arrangement of light sources of the lighting apparatus,
FIG. 4 schematically and exemplarily illustrates an image of the arrangement of light sources shown in FIG. 3 as generated by an imaging unit of the lighting apparatus,
FIG. 5 schematically and exemplarily illustrates a further possible ring of light sources of the lighting apparatus,
FIG. 6 schematically and exemplarily illustrates an image of the arrangement of light sources shown in FIG. 5 as generated by the imaging unit of the lighting apparatus.

FIG. 1 shows schematically and exemplarily an embodiment of a processing apparatus for processing an object. The processing apparatus 1 comprises a lighting apparatus 2 for providing light 4, which is used for processing the object 3. The processing apparatus 1 further comprises a moving unit 5 like a conveyer belt for moving the object 3 in the movement direction 6, in order to allow the processing apparatus 1 to process different parts of the object 3. The processing apparatus further comprises a control unit 7 for controlling at least one of the lighting apparatus 2 and the moving unit 5 such that during operation, when the moving unit 5 moves the object 3 relative to the lighting apparatus 2, light pulses of different light sources form a straight line on the object 3 being perpendicular to the movement direction 6. This allows the processing apparatus 1 to process the object 3 line-by-line. The processing apparatus 1 can be adapted to perform at least one of a printing procedure, a melting procedure and a sintering procedure by using the light 4 of the lighting apparatus 2 for processing the object. In particular, the processing apparatus 1 can be adapted to perform a CTP printing process.

Figure 2:
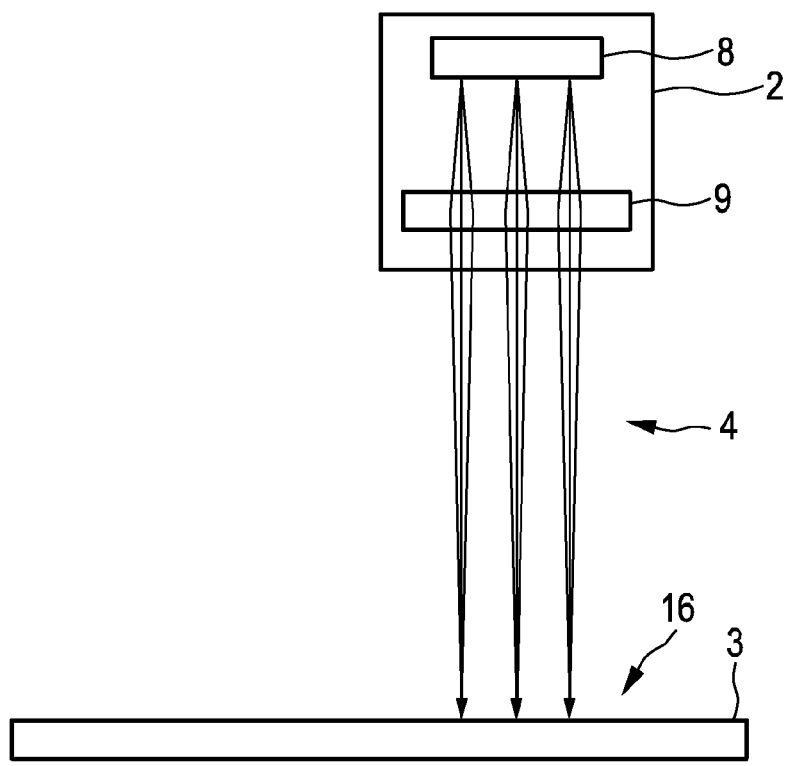
Figure 3:
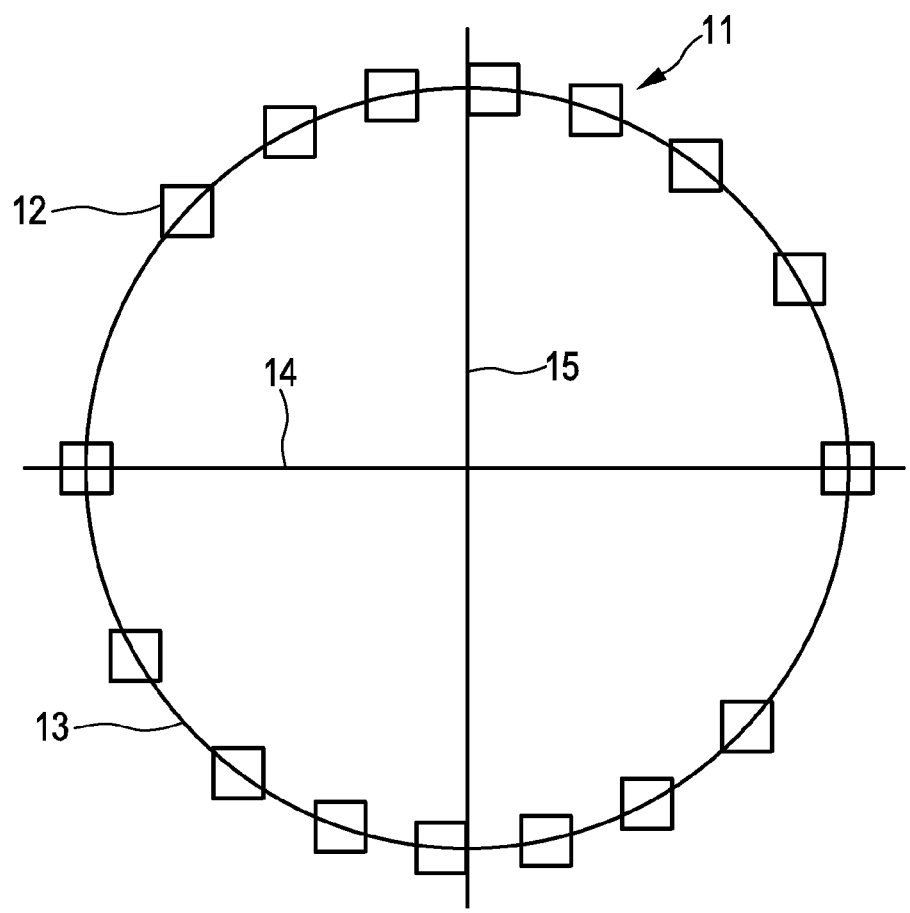

FIG. 2 shows schematically and exemplarily an embodiment of the lighting apparatus 2 in more detail. The lighting apparatus 2 comprises an arrangement 8 of light sources, which is illustrated in FIG. 3. The arrangement of light sources is a ring 11 of light sources 12 for generating the light 4 for processing the object 3. The lighting apparatus 2 further comprises an imaging unit 9 for imaging the ring 11 of light sources 12 onto a working plane 16 in which the object 3 is processed. The light sources 12 are arranged on a circle 13 having a first diameter 14 and a second diameter 15. In this embodiment, the light sources 12 are arranged such on the circle 13 that the respective center of the respective light source 12 coincides with the circle 13.

The imaging unit 9 may be a single simple lens, an achromat, an aspherical lens, a doublet or an objective comprising of two or more lenses.

Figure 4:
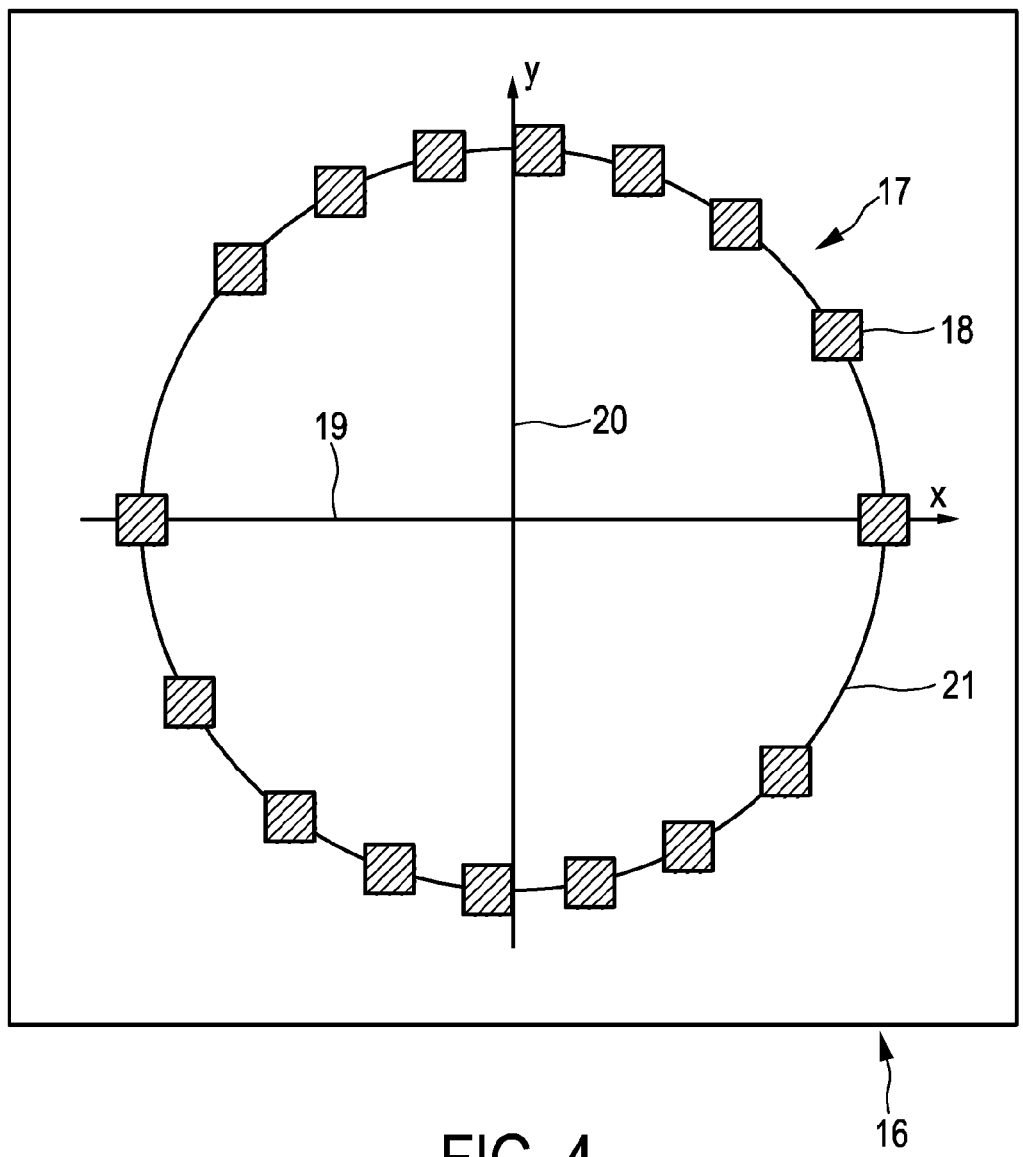

The imaged ring 17 formed by images 18 of the light sources in the working plane 16 is schematically and exemplarily illustrated in FIG. 4. The images 18 of the light sources are located on a circle 21 having a first diameter 19 and a second diameter 20. The ring 11 of the light sources 12 and the imaging unit 9 are configured such that mathematical projections of the images 18 of the light sources onto the first diameter 19 of the imaged ring 17 in the working plane 16 are distributed equidistantly. In other words, in a direction being parallel to the first diameter 19 the images 18 of the light sources are equidistantly distributed. Moreover, in this embodiment the ring 11 of light sources 12 and the imaging unit 9 are configured such that the mathematical projections of the images 18 of the light sources onto the first diameter 19 of the imaged ring 17 in the working plane 16 are adjacent to each other. Thus, the light sources 12 are arranged such that there is no gap between neighboring mathematical projections of the images 18 of the light sources onto the first diameter 19 of the imaged ring 17 in the working plane 16 and that there is also no overlap between these mathematical projections.

The imaged ring 21 has preferentially a radius R, which can be defined by following equation:

$$R = \frac{p}{2}(N-1), \quad (1)$$

wherein N indicates the number of light sources 12, which is, in this embodiment, 16, and wherein p indicates the pitch between two neighboring images 18 of a light source in the working plane 16 in the direction of the first diameter 19. The first diameter 19 can be regarded as defining an x-axis and the perpendicular second diameter 20 can be regarded as defining a y-axis. In the coordinate system defined by the x-axis and the y-axis the positions of the images 18 of the light sources can be defined by following equations:

$$x_i = p \cdot \left(i - \frac{N-1}{2}\right) \text{ and} \quad (2)$$

$$y_i = \pm \sqrt{R^2 - x_i^2} \text{ with } i = 1 \ldots N. \quad (3)$$

In this embodiment the width of the images 18 in the x-direction is similar to the pitch p of these images 18, i.e. similar to the distance between the centers of neighboring images 18 in the x-direction. Thus, if it is assumed that the imaging unit has a magnification factor of M, in equations (1) and (2) the pitch p of the images may be replaced by the product of the width of the light sources in the x-direction and the magnification factor.

In equation (3) the plus sign is used, if the index i is odd, and the minus sign is used, if the index i is even, or vice versa.

The light sources 12 are individually addressable VCSELs. They are arranged such that the movement direction 6, in which the object 3 is moved relative to the lighting apparatus 2, is perpendicular to the first diameter 14 of the ring 11 of light sources 12 and, thus, perpendicular to the first diameter 19 of the imaged ring 17. This allows providing the images 18 of the light sources adjacently along a straight line being perpendicular to the movement direction 6 of the object 3, in order to allow the processing apparatus 1 to process the object 3 line-by-line.

Figure 5:
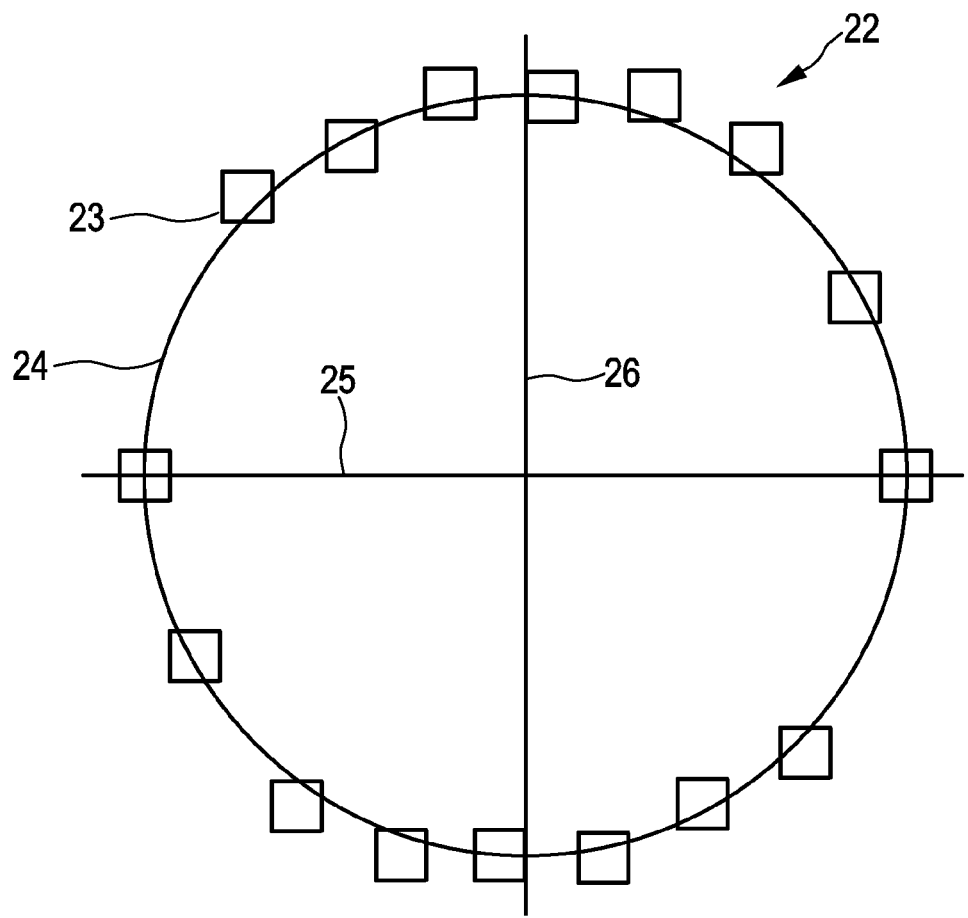
Figure 6:
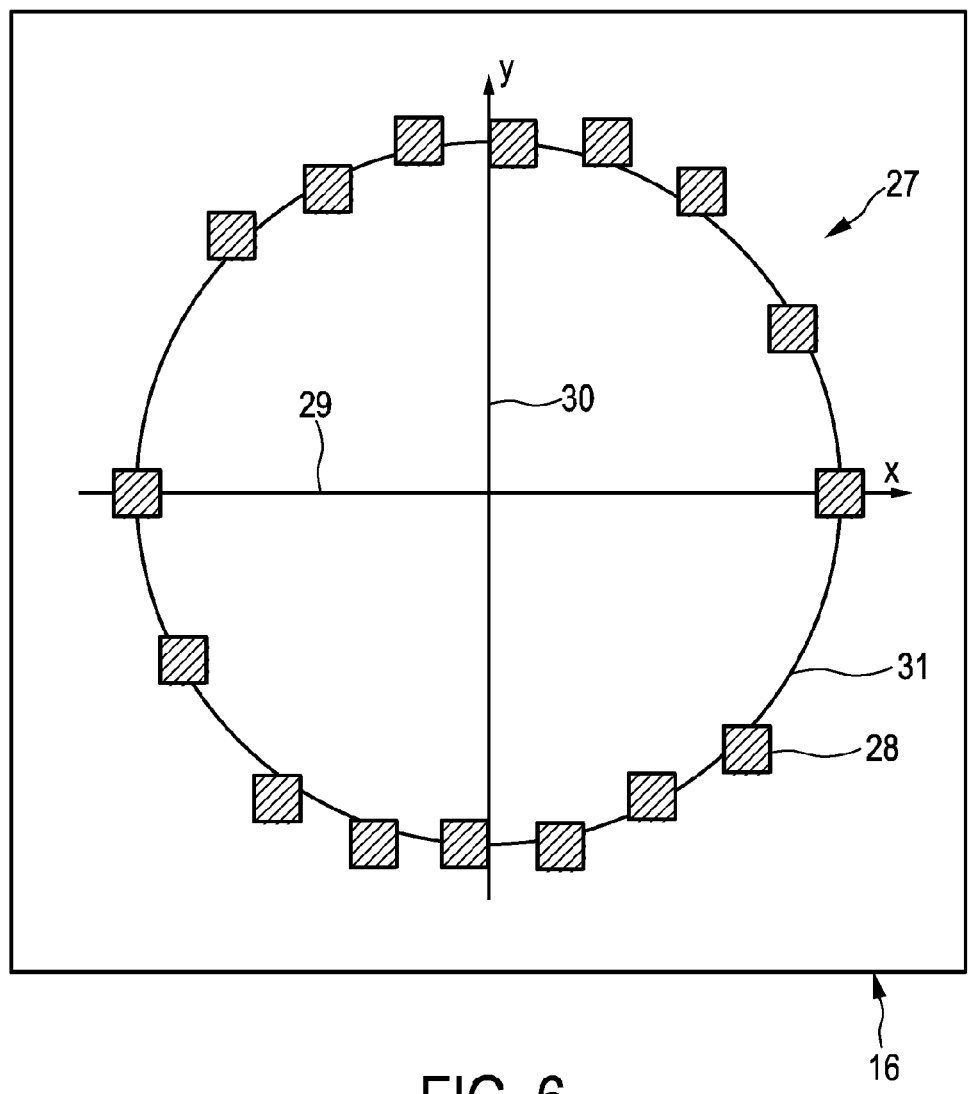

In FIGS. 3 and 4 the centers of the light sources 12 and of the images 18, respectively, coincide with the respective circles 13, 21, on which the light sources 12 and the images 18, respectively, are arranged. However, the light sources and images of the light sources can also be arranged in another way on the respective circle for providing the respective ring arrangement. For instance, as schematically and exemplarily shown in FIGS. 5 and 6, the ring 22 of light sources 23 and the imaging unit 9 can be configured such that the positions of the images 28 of the light sources in a direction being perpendicular to the first diameter 29 are defined by integer multiples of a same constant value, wherein this same constant value is preferentially the pitch of the images 28 of the light sources in the direction of the first diameter 29. Thus, the y-coordinates of the images 28 of the light sources may be integer multiples of the pitch of the images 28 of the light sources in the x-direction. Also in this example the light sources 23 form a ring arrangement 22, wherein in this example the centers of the light sources 23 do not necessarily coincide with a circle 24 along which the light sources 23 are arranged.

In particular, the circle 24 and, thus, the ring 22 have a first diameter 25 and a second diameter 26 being perpendicular to the first diameter 25. The imaged ring 27 shown in FIG. 6 comprises images 28 which are arranged along a circle 31 having a first diameter 29, which corresponds to the first diameter 25 of the ring 22 of light sources 23, and a second diameter 30, which corresponds to the second diameter 26 of the ring 22 of the light sources 23. Also in this example the first diameter 29 forms an x-axis and the second diameter 30 forms a y-axis. The radius of the circle 31 of the ring 27 of images 28 and the x-coordinates of the images 28 are defined by above mentioned equations (1) and (2). The y-coordinates correspond to the respective nearest y-coordinate, which is an integer multiple of the distance between neighboring light sources in the direction of the diameter, with respect to the y-positions defined by equation (3), i.e. in this example the y-coordinates defined by equation (3) are shifted to the nearest integer y-position defined by an integer multiple of the distance between neighboring light sources in the direction of the diameter, i.e. in the x-direction.

Figure 7:
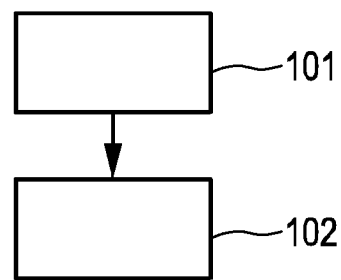
FIG. 7 shows a flowchart exemplarily illustrating an embodiment of a process method for processing an object.

In the following an embodiment of a processing method for processing an object in a working plane will exemplarily be described with reference to a flowchart shown in FIG. 7.

In step 101, processing light is generated for processing the object by a ring of light sources. In step 102, the ring of light sources is imaged onto the working plane in which the object is to be processed by an imaging unit, wherein projections of images of the light sources onto a diameter of the imaged ring in the working plane are distributed equidistantly. Moreover, in step 102 the object and the lighting apparatus are moved with respect to each other in a movement direction by a moving unit, wherein the movement direction is perpendicular to the diameter of the imaged ring. This allows the processing method to process the object in step 102 line-by-line, wherein each line is arranged perpendicular to the movement direction. In particular, at least one of the lighting apparatus and the moving unit are controlled such that, when the moving unit moves the lighting apparatus and the object relative to each other, light pulses of different light sources form a straight line on the object in the working plane. In an embodiment the moving unit moves the object with constant velocity with respect to the lighting apparatus, wherein the control unit controls the lighting apparatus such that given the constant velocity the light pulses, i.e. the images of the light sources, form straight parallel lines on the object for processing the same, wherein the straight lines are perpendicular to the movement direction.

VCSELs are especially useful for printing, in particular, for CTP printing, and for selective laser melting and selective laser sintering because of many advantages compared to edge-emitting lasers like the possibility of individually addressable two-dimensional array arrangements and circular beam shapes. For electrical separation a minimum gap is needed between neighboring VCSELs. Generally, for achieving a dense pixel pattern on the object, in particular, on the printing object, two or more rows of laser sources are shifted with respect to each other. Such a configuration is a straightforward design to enable individual electrical contacting. However, if such a two-dimensional array of VCSELs has to be imaged onto a working plane, problems occur. For instance, the imaging optics should generally have small dimensions to be cost efficient and to enable compact modules, but small imaging optics need short focal lengths and suffer therefore often from field curvature and aspherical and coma aberrations. Correcting these optical errors in the imaged VCSEL array requires technically very complex and costly optical modules. In order to overcome these drawbacks of known systems, in the imaging apparatus described above with reference to FIGS. 1 to 6 the VCSELs are arranged to form individual pixels on a ring with a radius being such that projections on the x-axis yields a dense pixel pattern. The optical aberrations can be corrected for sources on this radius with a less complex optical module compared to systems like the known systems described above comprising a full two-dimensional VCSEL array. The ring arrangement enhances therefore the image quality of the pixels and reduces the costs of the imaging optics at the same time. Moreover, a thermal cross talk between VCSELs can also be reduced.

The control unit can be adapted to calculate the necessary time delays for the individual channels, i.e. for the individual light sources, from the y-coordinates of the images of the light sources. If the y-coordinates of the images of the light sources are defined by integer multiples of the distance between neighboring images of the light sources in the direction of the first diameter, i.e. if the VCSEL arrangement deviates a bit from a perfect ring shape, the calculated time delays between light pulses of neighboring light sources in the x-direction are integer multiples of the time between two pulses of each channel, i.e. of the time between two light pulses of the same light source. This can simplify the control of the lighting apparatus and/or the moving unit.

Although in the above described embodiments the ring of light sources and the imaging unit are configured such that the projections of the images of the light sources on the first diameter of the imaged ring in the working plane are adjacent to each other such that there is no gap between neighboring mathematical projections and also no overlap between neighboring mathematical projections, in other embodiments the ring of light sources and the imaging unit can also be configured such that the mathematical projections of the images of the light sources on the first diameter of the imaged ring in the working plane overlap or such that there are gaps between neighboring mathematical projections.

Although in the above described embodiments the lighting apparatus comprises certain ring arrangements of the light sources, in other embodiments the lighting apparatus can also comprise another ring arrangement. For instance, the light sources can be arranged such that the centers of the light sources are located on a ring defined by an area between an inner circle and outer circle, wherein preferentially the radius of the inner circle is larger than 50 percent, further preferred larger than 75 percent and even further preferred larger than 90 percent of the radius of the outer circle.

The object can be a final object, which has to be processed by directly applying the radiation of the light sources to the object, or the object can be an intermediate object, which is processed by the light of the light sources, wherein the intermediate object can be used for processing a further object. For instance, the intermediate object can be a photoreceptor like a revolving drum or cylinder of a laser printer, which can be processed by light of the ring of light sources, in order to allow the laser printer to use a photoreceptor for laser printing a desired image or text.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality.

A single unit or device may fulfill the functions of several items recited in the claims. The mere fact that certain measures are recited in mutually different dependent claims does not indicate that a combination of these measures cannot be used to advantage.

The control of the processing apparatus in accordance with the processing method can be implemented as program code means of a computer program and/or as dedicated hardware.

A computer program may be stored/distributed on a suitable medium, such as an optical storage medium or a solid-state medium, supplied together with or as part of other hardware, but may also be distributed in other forms, such as via the Internet or other wired or wireless telecommunication systems.

Any reference sign in the claims should not be construed as limiting the scope.

The invention relates to a lighting apparatus for providing light for processing an object. A ring of light sources generates processing light for processing the object and an imaging unit images the ring of light sources onto a working plane in which the object is to be processed, wherein the ring of light sources and the imaging unit are configured such that images of the light sources in the working plane are distributed equidistantly in a direction being parallel to a diameter of the imaged ring in the working plane. The ring arrangement allows for a high quality imaging with a relatively small and technically simple optical element. A relatively small lighting apparatus can therefore be provided, which can be used for applications like laser printing.

The invention claimed is:
1. A lighting apparatus comprising:
   a light source that generates light for processing an object, the light source comprising a plurality of at least five light sources such that all of the light sources of the plurality of at least five light sources are arranged as a ring of light sources,
   an imaging unit for imaging the ring of light sources to form a ring of images on a working plane in which the object is processed, the working plane comprising two perpendicular axes, wherein the ring of light sources and the imaging unit are configured such that when all of the light sources are concurrently enabled, the images in the ring of images are uniformly spaced with respect to at least one of the axes of the working plane.

2. The lighting apparatus as defined in claim 1, wherein the ring of light sources and the imaging unit are configured such that projections of the images of the light sources onto the at least one axis in the working plane are adjacent to each other.

3. The lighting apparatus as defined in claim 2, wherein the imaged ring forms a circle in the working plane that has a radius R defined by $R=((N-1)*p)/2$, wherein N is the number of light sources and p is the pitch of the images of the light sources along the at least one axis in the working plane.

4. The lighting apparatus as defined in claim 1, wherein the ring of light sources and the imaging unit are configured such that projections of the images of the light sources onto the at least one axis in the working plane overlap.

5. The lighting apparatus as defined in claim 1, wherein the light sources are individually addressable.

6. The lighting apparatus as defined in claim 1, wherein the ring of light sources and the imaging unit are configured such that positions of the images of the light sources in a direction perpendicular to the at least one axis are defined by integer multiples of a distance along the at least one axis between neighboring light sources.

7. The lighting apparatus as defined in claim 1, wherein the light sources are lasers.

8. The light apparatus as defined in claim 7, wherein the light sources are vertical-cavity surface-emitting lasers.

9. The lighting apparatus as defined in claim 1, wherein the ring of light sources and the imaging unit are configured such that there is a gap between neighboring projections of the images of the light sources onto the first axis.

10. A processing apparatus for processing an object, the processing apparatus comprising
    a lighting apparatus comprising:
        a light source that generates light for processing the object, the light source comprising a plurality of at least five light sources, such that all of the light sources of the light source are arranged as a ring of light sources, and
        an imaging unit for imaging the ring of light sources to form a ring of images on a working plane in which the object is to be processed, the working plane comprising a first axis and a second axis that is perpendicular to the first axis,
    wherein the ring of light sources and the imaging unit are configured such that when all of the light sources are concurrently enabled, the images in the ring of images are uniformly spaced with respect to the first axis of the working plane.

11. The processing apparatus as defined in claim 10, wherein the processing apparatus further comprises a moving unit for moving the object and the lighting apparatus with respect to each other in a movement direction parallel to the second axis.

12. The processing apparatus as defined in claim 11, further comprising a control unit for controlling at least one of the lighting apparatus and the moving unit such that during operation, when the moving unit moves the lighting apparatus and the object relative to each other, a path of each image in the ring of images forms a straight line parallel to the second axis.

13. The processing apparatus as defined in claim 10, wherein the processing apparatus is adapted to perform at least one of the following procedures: printing, melting, sintering.

14. The processing apparatus as defined in claim 13, wherein the processing apparatus is adapted to perform a computer-to-plate printing process.

15. A processing method for processing an object, the method comprising:
    generating processing light for processing the object by a light source that comprises a plurality of at least five light sources, all of the light sources of the plurality of at least five light sources being arranged as a ring of light sources,
    imaging the ring of light sources onto a working plane in which the object is to be processed by an imaging unit, wherein the working plane comprises a first axis and a second axis that is perpendicular to the first axis, and wherein, when all of the light sources are enabled, the images in the ring of images are uniformly spaced with respect to the first axis of the working plane, and
    moving the object and the lighting apparatus with respect to each other by a moving unit in a movement direction parallel to the second axis.

16. A non-transitory computer-readable medium that includes a computer program that, when executed by a processing apparatus, causes the processing apparatus to carry out the steps of the processing method as defined in claim 15.

17. A method of producing an object comprising:
    controlling a light source that selectively provides light that melts or sinters material to form the object, and
    controlling a movement of the material relative to the light source,
    wherein
    the light source comprises a plurality of at least five light sources, such that all of the light sources of the light source are arranged as a ring of light sources, and
    concurrent projections of each light source of the light sources of the ring of light sources on an axis of a working plane are uniformly spaced.

18. The method of claim 17, wherein the light melts the material.

19. The method of claim wherein the light sinters the material.

20. A machine that includes the light source of claim 17, and non-transitory computer readable medium that includes a program that is configured to control the machine to perform the method of claim 17.

* * * * *